(12) United States Patent
Song et al.

(10) Patent No.: US 9,363,070 B2
(45) Date of Patent: Jun. 7, 2016

(54) LOW POWER SQUELCH CIRCUIT

(75) Inventors: Hongjiang Song, Mesa, AZ (US);
Dianbo Le, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/994,096

(22) PCT Filed: Dec. 21, 2011

(86) PCT No.: PCT/US2011/066476
§ 371 (c)(1),
(2), (4) Date: Jul. 15, 2014

(87) PCT Pub. No.: WO2013/095432
PCT Pub. Date: Jun. 27, 2013

(65) Prior Publication Data
US 2015/0222417 A1    Aug. 6, 2015

(51) Int. Cl.
*H04L 7/00* (2006.01)
*H03F 3/45* (2006.01)
*H03G 1/00* (2006.01)
*H04L 7/10* (2006.01)

(52) U.S. Cl.
CPC .......... *H04L 7/0079* (2013.01); *H03F 3/45475* (2013.01); *H03G 1/0094* (2013.01); *H04L 7/10* (2013.01); *H03F 2203/45514* (2013.01); *H03F 2203/45551* (2013.01)

(58) Field of Classification Search
CPC .... G11C 11/5621; G11C 16/12; G11C 27/02; H03G 1/0094; H03G 3/34; H03G 3/342; H03G 3/344; H03K 5/1252; H04L 7/0079; H04L 7/10; H03F 3/45475; H03F 2203/45551; H03F 2203/45514
See application file for complete search history.

(56) References Cited

U.S. PATENT DOCUMENTS

| 4,495,445 | A | * | 1/1985 | Turney ........................ 315/169.1 |
| 6,157,688 | A | * | 12/2000 | Tamura et al. ................. 375/348 |
| 7,092,474 | B2 | | 8/2006 | Cao |
| 7,209,011 | B2 | * | 4/2007 | Welland et al. ............. 331/36 L |
| 2001/0036237 | A1 | * | 11/2001 | Storm et al. .................. 375/350 |
| 2004/0157576 | A1 | | 8/2004 | Adachi et al. |
| 2007/0273438 | A1 | * | 11/2007 | Hickman et al. ................. 330/69 |
| 2011/0138096 | A1 | * | 6/2011 | Radulescu et al. ............ 710/305 |
| 2011/0221518 | A1 | * | 9/2011 | Romero ........................ 327/554 |
| 2011/0267212 | A1 | | 11/2011 | Denison |

FOREIGN PATENT DOCUMENTS

| CN | 101568805 A | 10/2009 |
| CN | 101641901 A | 2/2010 |

OTHER PUBLICATIONS

Int'l Search Report and Written Opinion mailed Sep. 26, 2012 for Int'l Patent Application No. PCT/US2011/066476.

(Continued)

*Primary Examiner* — Vineeta Panwalkar
(74) *Attorney, Agent, or Firm* — Blakely, Sokoloff, Taylor & Zafman LLP

(57) ABSTRACT

Described herein is a low power squelch circuit which comprises a clock generation unit to generate first and second phases of a clock signal; a sampling unit to sample a differential input signal according to the first and second phases of the clock signal, the sampler to generate a sampled differential signal; and a differential amplifier to amplify the sampled differential signal.

22 Claims, 7 Drawing Sheets

(56) References Cited

OTHER PUBLICATIONS

Office Action and Taiwan Search Report from foreign counterpart Taiwan Patent Application No. 101142868, mailed Nov. 11, 2014, 15 pages.

International Preliminary Report on Patentability for International Application No. PCT/US2011/066476, mailed Jul. 3, 2014, 7 pages.
Taiwan Appln. No. 101142868 Notification of Allowance, Apr. 27, 2015, 6 pgs.

* cited by examiner

Sampling Unit 211

Differential Amplifier 212

500 generating first and second phases of a clock signal
501 sampling a differential input signal according to the first and second phases of the clock signal, the sampling to generate a sampled differential signal
502 amplifying the sampled differential signal to generate an output signal
503 turning on or off a logic unit according to the output signal
504

FIG. 5

LOW POWER SQUELCH CIRCUIT

CLAIM OF PRIORITY

This application claims the benefit of priority of International Patent Application No. PCT/US2011/066476 filed Dec. 21, 2011, titled "Low POWER SQUELCH CIRCUIT," which is incorporated by reference in its entirety.

FIELD OF THE INVENTION

Embodiments of the invention relate generally to the field of processors. More particularly, embodiments of the invention relate to a low power squelch circuit.

BACKGROUND

A typical squelch circuit is a multi-stage circuit that consists of the multiple amplification circuit stages, current-mode logic (CML) to complementary metal-oxide semiconductor (CMOS) converter, an integration stage and a comparator. Such circuits also include other supporting circuits such as current bias, threshold circuits, and the offset calibration circuits. These circuit blocks are used for detecting a signal and for compensating circuit non-idealities such as DC (direct current) offset. However, such squelch circuits are unable to meet the stringent low power specifications of Mobile Industry Processor Interface (MIPI®) as described in the MIPI® Alliance Specification for M-PHY$^{SM}$ Version 1.00.00 of Feb. 8, 2011 and approved on Apr. 28, 2011.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 5 is a method flowchart for detecting a signal using the squelch circuit, according to one embodiment of the invention.

DETAILED DESCRIPTION

Figure 1A:
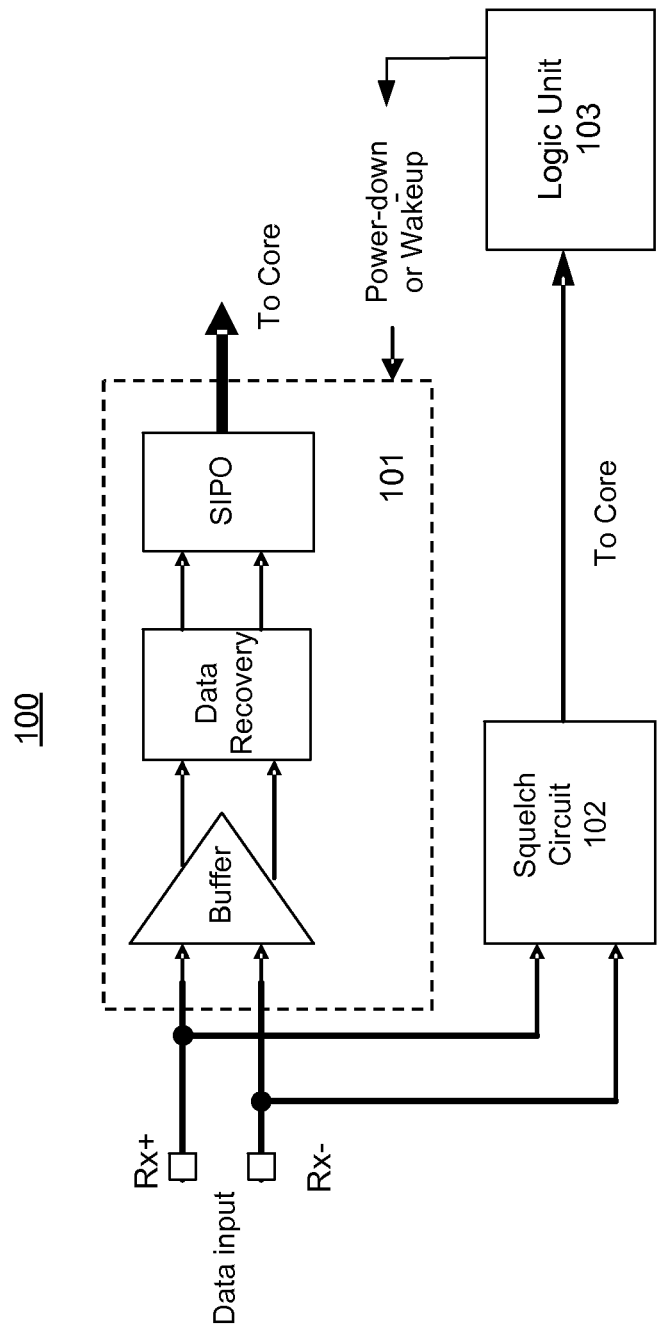
FIG. 1A is an input-output (I/O) receiver (Rx) with a squelch circuit for detecting a signal at the Rx, according to one embodiment of the invention.

Embodiments of the invention relate to a low power squelch circuit. In one embodiment, the low power squelch circuit comprises a clock generation unit to generate first and second phases of a clock signal; a sampling unit to sample a differential input signal according to the first and second phases of the clock signal, the sampler to generate a sampled differential signal; and a differential amplifier to amplify the sampled differential signal.

In one embodiment, the sampling unit comprises: a first switch to sample a first signal of the differential input signal to generate a first sampled signal of the sampled differential signal; and a second switch to sample a second signal of the differential input signal to generate a second sampled signal of the sampled differential signal, wherein the first and second switches are operable by the first phase of the clock signal. In one embodiment, the sampling unit comprises: a third switch to couple the first signal, of the differential amplified signal, to a node coupled to the second switch. In one embodiment, the sampling unit further comprises: a fourth switch to couple the second signal, of the differential amplified signal, to a node coupled to the first switch, wherein the third and fourth switches are operable by the second phase of the clock signal. In one embodiment, the first switch is coupled to the differential amplifier via a first capacitor. In one embodiment, the second switch is coupled to the differential amplifier via a second capacitor.

In one embodiment, the squelch circuit further comprises a fifth switch for coupling a ground node with an input of the differential amplifier via a third capacitor, wherein the fifth switch is operable by the first phase of the clock signal. In one embodiment, squelch circuit further comprises a sixth switch for coupling a high power supply node with the input of the differential amplifier via the third capacitor, wherein the sixth switch is operable by the second phase of the clock signal. In one embodiment, the squelch circuit further comprises a seventh switch for coupling a ground node with an input of the differential amplifier via a fourth capacitor, wherein the seventh switch is operable by the first phase of the clock signal. In one embodiment, the squelch circuit further comprises a eighth switch for coupling a high power supply node with the input of the differential amplifier via the fourth capacitor, wherein the eighth switch is operable by the second phase of the clock signal. In one embodiment, the squelch circuit further comprises a ninth switch for coupling a first output of the differential amplifier with an input of the differential amplifier, wherein the ninth switch is operable by the second phase of the clock signal. In one embodiment, the squelch circuit further comprises a tenth switch for coupling a second output of the differential amplifier with another input of the differential amplifier, wherein the tenth switch is operable by the second phase of the clock signal.

The technical effects of the embodiments discussed herein are many. For example, the squelch circuit described herein provides micro-power operation, high squelch detection accuracy, employs built-in auto-zero function, has a fully differential and ratio-based circuit structure, and provides low design/validation cost using highly simplified circuit elements and design. The squelch circuit described herein may be used as a power-up detector in a processor for detecting power supply. The technical effects discussed herein are not limited to the above effects. Other technical effects are contemplated by the embodiments discussed herein.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

The term "performance" herein generally refers to power supply rejection ratio (PSRR), power consumption, process-temperature-voltage (PVT) variations, area, scalability to lower power supply voltages, I/O transfer rate, etc.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The term "wide frequency ranges" or "high speed" herein refers to at least high speed (HS) GEAR ranges from HS-GEAR 1 to HS-GEAR 3 as described in the MIPI® Alliance Specification for M-PHY$^{SM}$ Version 1.00.00 of Feb. 8, 2011 and approved on Apr. 28, 2011.

FIG. 1A is an input-output (I/O) receiver (Rx) 100 with a squelch circuit 102 for detecting a signal at the Rx 100, according to one embodiment of the invention. In one embodiment, the Rx 100 comprises a data recovery unit 101 comprising a buffer, a data recovery circuit, and a serial-to-parallel (SIPO) generator. In such an embodiment, the data recovery unit 101 receives a differential input signal Rx+ and Rx− and generates data for processing by another unit. In one embodiment, the squelch circuit 102 continuously monitors the input signals Rx+ and Rx− to identify whether the input signals Rx+ and Rx− are carrying data or noise. In one embodiment, the squelch circuit 102 provides its output to a logic unit 103 which is used for power management of the Rx 100 and other logic units in the processor.

For example, the logic unit 103 may use the output of the squelch circuit 102 to determine whether to power down the data recovery unit 101 or any other logic unit because the squelch circuit 102 output indicates that the input signals Rx+ and Rx− are carrying only noise and no data for processing. In another example, the logic unit 103 may use the output of the squelch circuit 102 to determine whether to power up or wake up the data recovery unit 101 or any other logic unit because the squelch circuit 102 output indicates that the input signals Rx+ and Rx− are carrying only data.

In one embodiment Rx 100 can be used as a Mobile Industry Processor Interface (MIPI®) M-PHY$^{SM}$ receiver; a Peripheral Component Interconnect Express (PCIe) receiver; a Serial Advanced Technology Attachment (SATA) receiver; a Serial Attached SCSI (SAS) receiver; a Double Data Rate x (DDRx) receiver, were 'x' is an integer, for example, x=4 and above; a High-Definition Multimedia Interface (HDMI) receiver; or a Universal Serial Bus x (USBx) receiver, where 'x' is an integer, for example x=2 and above.

Figure 1B:
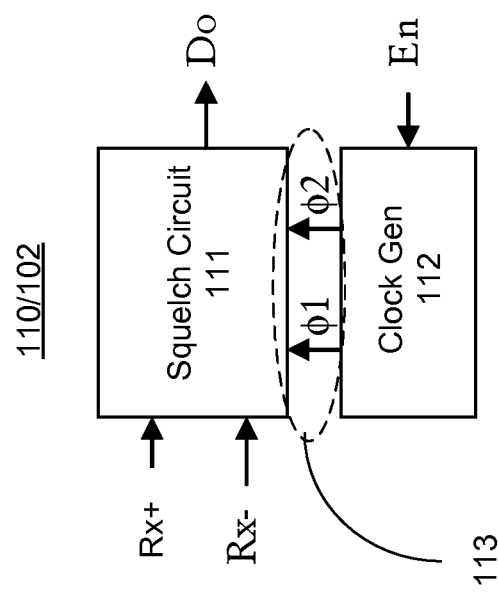
FIG. 1B is a high-level block diagram of a squelch circuit unit for detecting a signal, according to one embodiment of the invention.

FIG. 1B is a high-level block diagram of a squelch circuit unit 110/102 for detecting a signal, according to one embodiment of the invention. In one embodiment, the squelch circuit unit 110/102 comprises a squelch circuit 111 communicatively coupled to a clock generation unit 112. While the embodiments describe a squelch circuit 111 as a separate unit coupled to a clock generation unit 112, both units can be in one logical unit according to one embodiment. In one embodiment, the squelch circuit 111 monitors the signals Rx+ and Rx− using switch capacitor sampling circuit, which is described with reference to FIGS. 2A-C and FIG. 3, that is controlled by at least two phases 113 (Φ1 and Φ2) generated by the clock generation unit 112. The output Do of the squelch circuit 111 is received by another logic unit, for example logic unit 103, which determines whether to power down or wakeup any other logic unit according to the information in signal Do. In one embodiment, the clock generation unit 112 is operable to be enabled by the signal En, which is described with reference to FIG. 4.

Figure 2A:
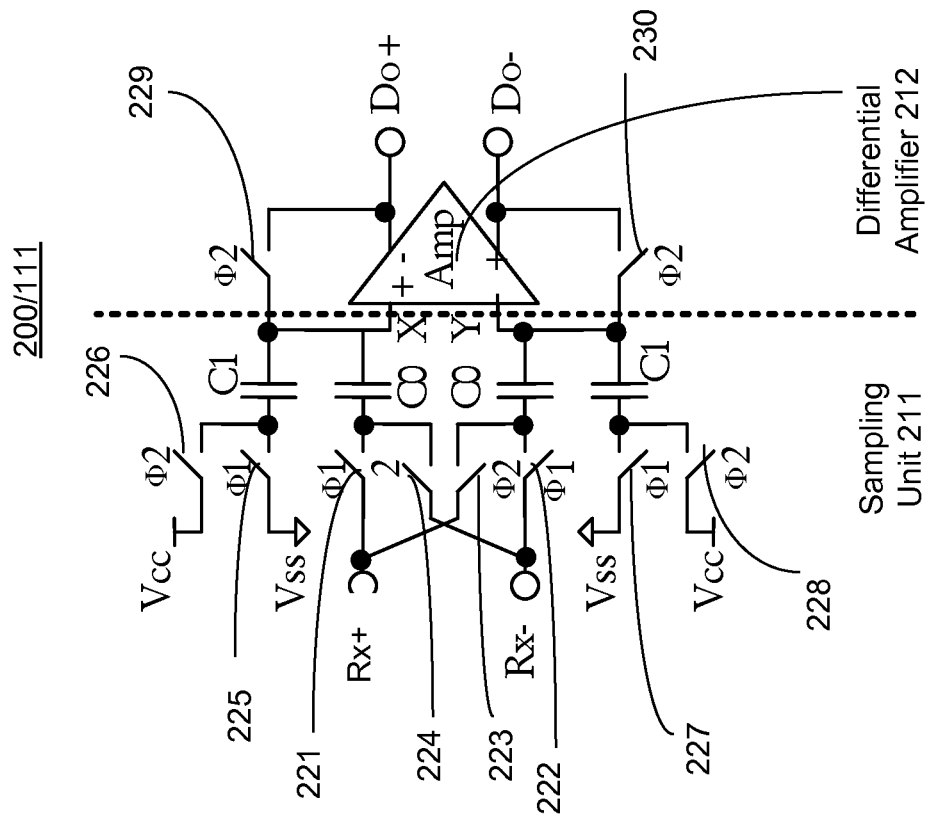
FIG. 2A is a squelch circuit, according to one embodiment of the invention.

FIG. 2A is a squelch circuit 200/111, according to one embodiment of the invention. In one embodiment, the squelch circuit 200/111 comprises a sampling unit 211 coupled to a differential amplifier 212. In one embodiment, the sampling unit 211 comprises a first switch 221 to sample a first signal Rx+ of the differential input signal (e.g., data_input) to generate a first sampled signal X of the sampled differential signal (X and Y). In one embodiment, the first switch 221 is operable by a first phase Φ1 of a clock signal. In one embodiment, the first switch 221 is coupled to an input node X of the differential amplifier 212 via a first capacitor C0. The term 'X' is interchangeably used to refer to node X or the first sampled signal X which implies that the node X is carrying the first signal after being sampled by the second switch 221.

In one embodiment, the sampling unit 211 comprises a second switch 222 to sample a second signal Rx− of the differential input signal (e.g., data_input) to generate a second sampled signal Y of the sampled differential signal. In this embodiment, the second switch 222 is operable by the first phase Φ1 of the clock signal. In one embodiment, the second switch 222 is coupled to another input Y of differential amplifier 212 via a second capacitor C0. The term 'Y' is interchangeably used to refer to node Y or the second sampled signal Y which implies that the node Y is carrying the second signal after being sampled by the second switch 222.

In one embodiment, the sampling unit 211 comprises a third switch 223 to couple the first signal Rx−, of the differential amplified signal, to a node coupled to the second switch 222. In this embodiment, the third switch 223 is operable by a second phase Φ2 of the clock signal. In one embodiment, the sampling unit 222 further comprises a fourth switch 224 to couple the second signal Rx−, of the differential amplified signal, to a node coupled to the first switch 221. In this embodiment, the fourth switch 224 is operable by a second phase Φ2 of the clock signal.

In one embodiment, the squelch circuit 211 further comprises a fifth switch 225 for coupling a ground node with the node X, which is input to the differential amplifier 212, via a third capacitor C1. In this embodiment, the fifth switch is operable by the first phase Φ1 of the clock signal. In one embodiment, squelch circuit 211 comprises a sixth switch 226 for coupling a high power supply node (Vcc) with the input node X of the differential amplifier 212 via the third capacitor C1. In this embodiment, the sixth switch 226 is operable by the second phase Φ2 of the clock signal.

In one embodiment, the squelch circuit 211 further comprises a seventh switch 227 for coupling a ground node with the input node Y of the differential amplifier 212 via a fourth capacitor C1. In this embodiment, the seventh switch 227 is operable by the first phase Φ1 of the clock signal. In one embodiment, the squelch circuit 211 further comprises an eighth switch 228 for coupling a high power supply node Vcc with the input node Y of the differential amplifier 212 via the fourth capacitor C1. In this embodiment, the eighth switch 228 is operable by the second phase Φ2 of the clock signal. In one embodiment, the values of capacitors C0 and C1 are in the range of 50 fF to 500 fF. In one embodiment, the ratio of capacitor C0 to capacitor C1 (C0:C1) is substantially close to 10. The term "substantially" herein refers to being within 20% of the desired value. For example, the capacitance ratios being substantially close to 10 (the desired value) means that the ratio can be 1:10, 1:8, 1:12, etc.

In one embodiment, the squelch circuit 211 further comprises a ninth switch 229 for coupling a first output Do+ of the differential amplifier 212 with the input node X of the differential amplifier 212. In this embodiment, the ninth switch 229 is operable by the second phase Φ2 of the clock signal. The term 'Do+' is interchangeably used to refer to node Do+ or the first amplified signal Do+ which implies that the node Do+ is carrying the first amplified signal after being amplified by the amplifier 212.

In one embodiment, the squelch circuit 211 further comprises a tenth switch 230 for coupling a second output Do− of the differential amplifier 212 with the other input node Y of the differential amplifier 212. In this embodiment, the tenth switch 230 is operable by the second phase Φ2 of the clock signal. The term 'Do−' is interchangeably used to refer to node Do− or the second amplified signal Do− which implies that the node Do− is carrying the second amplified signal after being amplified by the amplifier 212.

For purposes of this application, the transistors described herein are metal oxide semiconductor (MOS) transistors, which include drain, source, and gate terminals. However, those skilled in the art will appreciate that other transistors may be used without departing from the scope of the invention.

The switches discussed herein are implemented as transistors (e.g., MOS transistors) controlled by the phases of clock signals. For example, the first switch 221 is controlled by the phase Φ1 of the clock signal. The term "controlled by" herein refers to turning on or off the switch during the phase Φ1 of the clock signal. In one embodiment, the signal carrying the phase Φ1 of the clock signal is coupled to a gate terminal of the transistor being controlled by the phase Φ1 of the clock signal. In such an embodiment, the switch is turned on during the phase Φ1, where phase Φ1 is a logical low of phase of the clock signal. The embodiments of the invention can also operate by reversing the logic such that the switch is turned off during the phase Φ1, where phase Φ1 is a logical high of phase of the clock signal.

Figure 3:
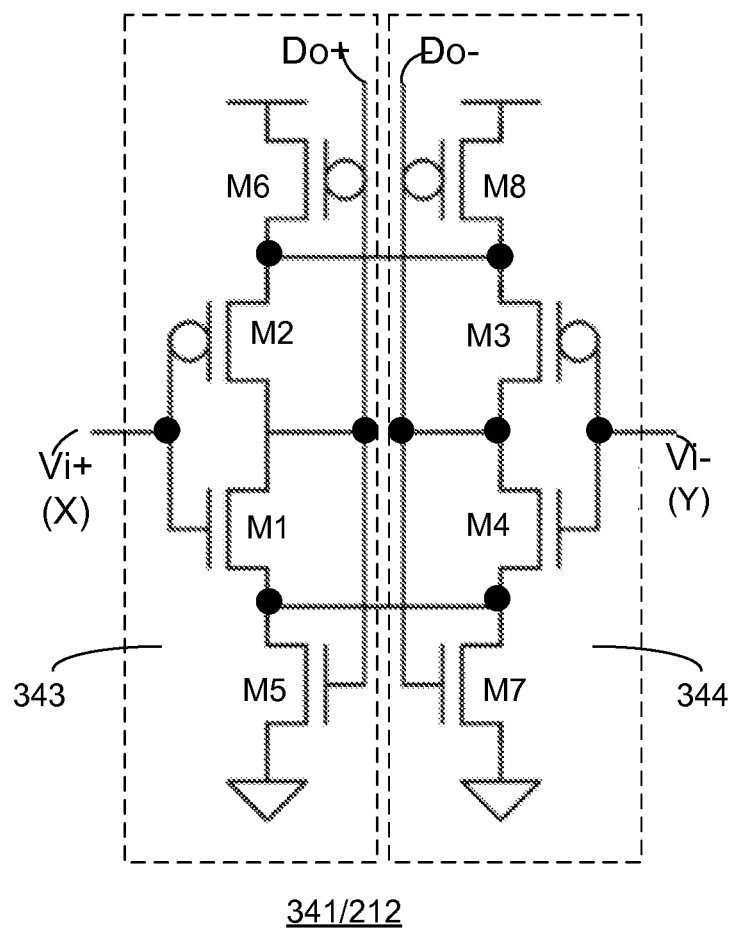
FIG. 3 is a circuit level implementation of an amplifier in the squelch circuit, according to one embodiment of the invention.

In one embodiment, the amplifier 212 is a differential amplifier 341/212 as described herein with reference to FIG. 3.

In one embodiment, the differential amplifier 341/212 is a self-biased symmetrical load output buffer circuit. In one embodiment, the differential amplifier 341 receives as inputs the sampled first and second signals X and Y from the sampling unit 211 and generates differential signals D0+ and Do− respectively. In one embodiment, the differential amplifier 341 is operable to reject common mode in the sampled first and second signals (differential signals). In one embodiment, the differential amplifier 341 has a built-in auto-zero function. In one embodiment, the differential amplifier 341 is operable to amplify the sampled first and second signals X and Y from the sampling unit 201 independent of offset cancellation in the sampled differential signal.

In one embodiment, the differential amplifier 341 comprises two complementary MOS (CMOS) transistor pairs (M1, M2, and M3, M4) that are used as the input devices, which extend the input signal to full swing. In one embodiment, additional CMOS transistor pairs (M5, M6, and M7, M8) are used for either current biases or loads. The gate terminals of the bias/load transistors may be coupled together as illustrated. In these embodiments, circuits 343 and 344 are symmetric at both left-to-right and top-to-bottom directions. Three feedback loops are provided in the circuit structure, including a left loop by transistors M1, M2, M5, and M6, a right loop by transistors M3, M4, M7, and M8, and a common mode loop by transistors M5, M6, M7, and M8.

In one embodiment, the transistors M1, M4, M5, and M7 are n-type MOS (NMOS) transistors while transistors M2, M3, M6, and M8 are p-type MOS (PMOS) transistors as shown in FIG. 3.

The embodiment of the differential amplifier 341 provides higher bias current around the cross-point to achieve approximately zero DC (direct current) bias, high speed switching, and a "soft landing" (e.g., substantially avoiding noise and glitches in the signal). These properties help make the differential amplifier 341 more robust for various applications (e.g., large power supply range, rail-to-rail signal swings, large transistor size range, etc.,) and scalable for different manufacturing process technologies.

Figure 2B:
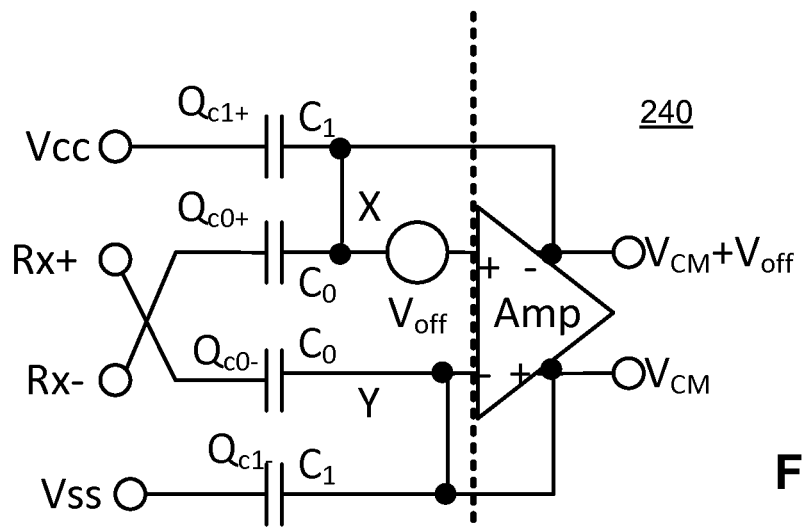
FIG. 2B is the squelch circuit operating in auto-zero phase, according to one embodiment of the invention.

FIG. 2B is the squelch circuit 240 operating in auto-zero phase, according to one embodiment of the invention. In the auto-zero phase (Φ2 phase), the amplifier 212 outputs Do+/Do− and inputs X/Y are electrically shorted. The DC offset (Voff) of the amplifier 212 is sampled and stored in the sampling capacitors C1 and C0 for offset compensation in the sampling phase. In the phase Φ2 both outputs Do+/Do− are forced to the common-mode voltage $V_{CM}$. The charges (Q) stored in the four capacitors—two C1s and two C0s—may be provided as:

$$\begin{cases} Q_{C1+} = C_1(V_{CC} - V_{CM} - V_{off}) \\ Q_{C1-} = C_1(V_{SS} - V_{CM}) \\ Q_{C0+} = C_0(V_{RX-} - V_{CM} - V_{off}) \\ Q_{C0-} = C_0(V_{RX+} - V_{CM}) \end{cases}$$

Figure 2C:
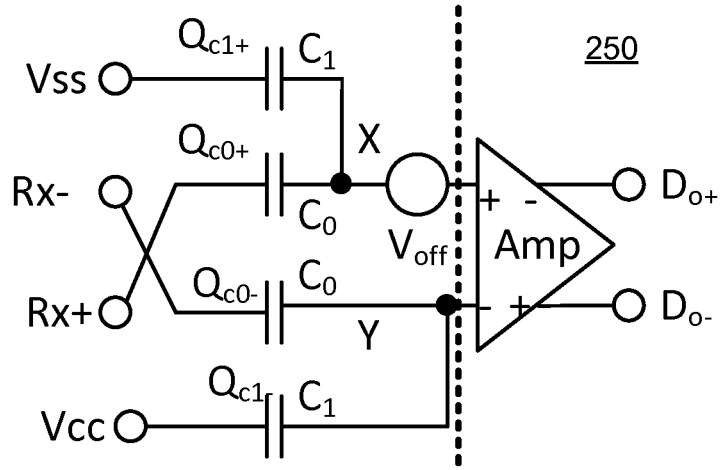
FIG. 2C is the squelch circuit operating in sampling phase, according to one embodiment of the invention.

FIG. 2C is the squelch circuit 250 operating in sampling phase, according to one embodiment of the invention. In the sampling phase (Φ1 phase), the amplifier 212 outputs Do+/Do− and inputs X/Y are no longer electrically shorted. The charges (Q) stored in the four capacitors—two C1s and two C0s—may be provided as:

$$\begin{cases} Q_{C1+} = C_1(V_{SS} - V_X) \\ Q_{C1-} = C_1(V_{CC} - V_Y) \\ Q_{C0+} = C_0(V_{RX+} - V_X) \\ Q_{C0-} = C_0(V_{RX-} - V_Y) \end{cases}$$

Applying the charge redistribution principle (charge conservation), the following equations are determined according to the charges (Qs) described herein:

$$\begin{cases} C_1(V_{CC} - V_{CM} - V_{off}) + C_0(V_{RX-} - V_{CM} - V_{off}) = C_1(V_{SS} - V_X) + \\ C_0(V_{RX+} - V_X) \\ C_1(V_{SS} - V_{CM}) + C_0(V_{RX+} - V_{CM}) = C_1(V_{CC} - V_Y) + C_0(V_{RX-} - V_Y) \end{cases}$$

Solving the differential inputs ($V_X$–$V_Y$) of the amplifier 212, where $V_X$ and $V_Y$ are voltages on nodes X and Y at the input of the amplifier 212, the following equation can be achieved:

$$(V_X - V_Y) = \frac{2C_0}{C_0 + C_1}\left[(V_{RX+} - V_{RX-}) - \frac{C_1}{C_0}(V_{CC} - V_{SS})\right] + V_{off}$$

In this embodiment, the outputs ($V_{Do+}$–$V_{Do-}$) of the amplifier 212 at the sampling phase can be described as:

$$(V_{o+} - V_{o-}) = $$
$$G(V_X - V_{off} - V_Y) = G\frac{2C_0}{C_0 + C_1}\left[(V_{RX+} - V_{RX-}) - \frac{C_1}{C_0}(V_{CC} - V_{SS})\right]$$

The above equation shows that the output of the differential amplifier 212 is proportional to the differential of the differential input magnitude and a voltage threshold set by the supply voltage Vcc. In this embodiment, threshold voltage of the squelch circuit 211 is directly generated from the supply voltage Vcc. Supply voltages generally have a tight accuracy, for example 5-10% accuracy.

This allows the squelch circuit 211 to detect signals (Rx+ and Rx−) with swings above 140 mV and below 50 mV as required by MIPI® compliant circuit as described by the MIPI® Alliance Specification for M-PHY$^{SM}$ Version 1.00.00 of Feb. 8, 2011 and approved on Apr. 28, 2011, p. 96 Table 22. In one embodiment, when the squelch circuit 211 detects any signal below 50 mV at its inputs then it indicates that the inputs have noise on them and do not contain any data. In one embodiment, when the squelch circuit 211 detects a signal above 140 mV at its inputs then it indicates that the inputs are data. In the above two embodiments, the logic unit 103 keeps circuits on. For example, the data recovery circuit 101 is powered on or brought from sleep mode to wakeup mode in response to the output of the squelch circuit 211.

The squelch circuit 211 in this embodiment effectively eliminates the need for a biasing circuit. In one embodiment, the operation of the squelch circuit 211 is based on capacitance ratio, which is inherently accurate and cancels variations caused by process-voltage-temperature (PVT) variations. In the embodiments discussed herein, the squelch circuit 211 provides a built-in auto-zero capability to eliminate mismatches in the differential amplifier 212.

Figure 4:
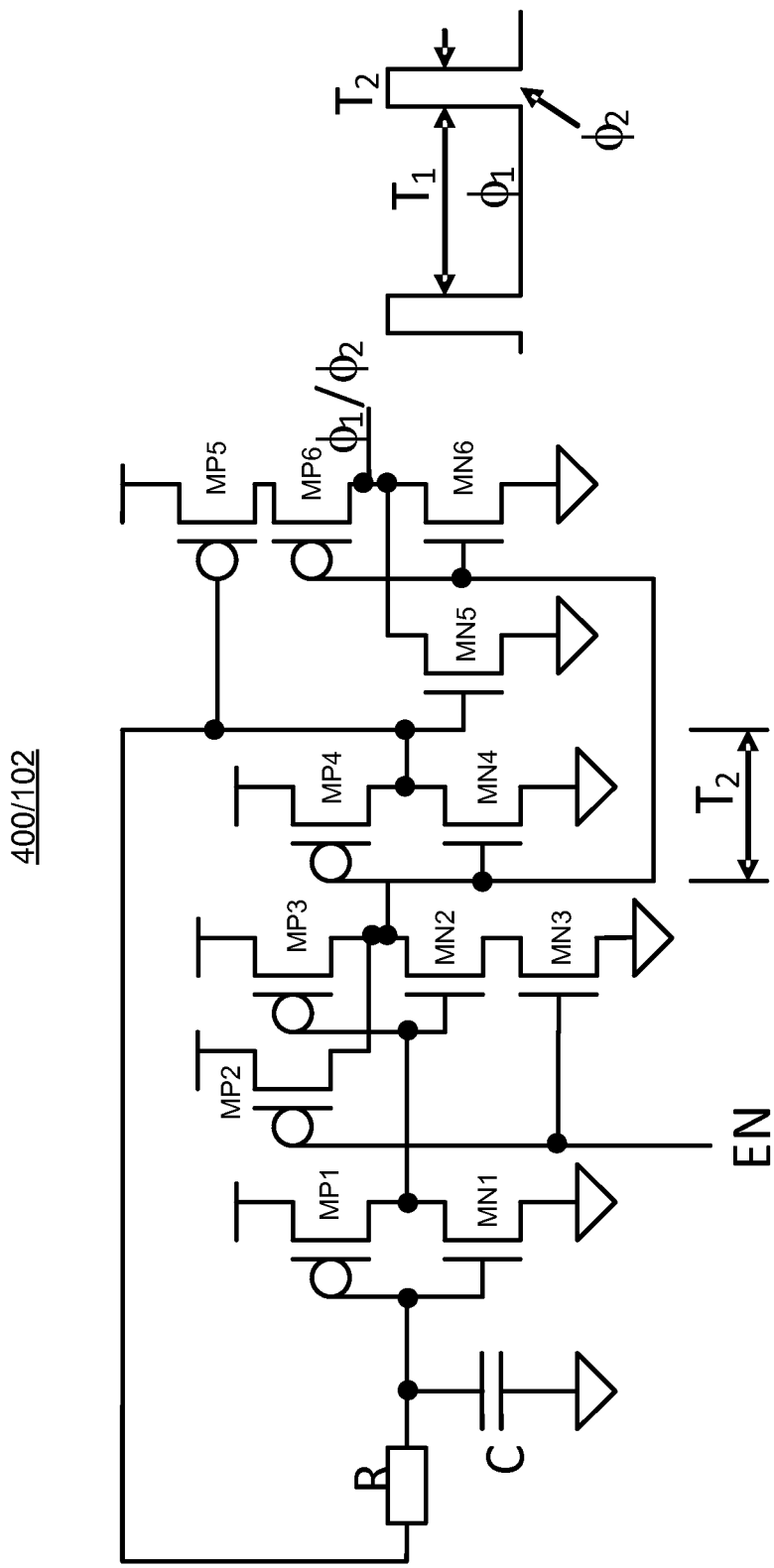
FIG. 4 is a clock generation circuit coupled to the squelch circuit, according to one embodiment of the invention.

FIG. 4 is a clock generation circuit 400/102 coupled to the squelch circuit 111, according to one embodiment of the invention. In one embodiment, the clock generation circuit 400/102 generates a low (non-50%) duty cycle output based on a RC (resistor-capacitor) ring oscillator (RO). The clock generation circuit 400/102 consumes low power dissipation compared to traditional clock generators (e.g., a phase locked loop) to support the operation of the squelch circuit 111. In one embodiment, any available clock signal in the chip/processor can be used to provide the phases Φ1 and Φ2. In such an embodiment, clock generation circuit 400/102 can be disabled (via the EN signal) or eliminated to further reduce the size of the squelch circuit unit 110/102 and thus its power dissipation.

In one embodiment, the RO comprises transistors MP1 and MN1 that form the first inverting stage. In this embodiment, transistors MP3 and MN2 and MN3 form the second inverting stage, and transistors MP4 and MN4 form the third inverting stage to form a ring such that the output of the third inverting stage is input to the gate terminals of the first inverting stage via a low pass filter RC network. In one embodiment, capacitance of C is in the range of 500 fF to 1 pF while the resistance is in the range of 500 KOhms to 20 MOhms. In this embodiment, changing the values of R and C changes the frequency of the RO and thus the frequency of the output clock signal. The values of R and C, in one embodiment, are programmable by hardware logic or software instructions.

In one embodiment, the EN signal is coupled to the gate terminals of MP2 and MN3. When the EN signal is of logical low level, transistor MN3 is turned off and transistor MP2 is turned on causing the transistor MP6 to turn off and thus disabling the clock generating unit 400/102. In one embodiment, the RC network may be eliminated and the output of third stage is input to the first stage of the RO.

While the embodiments herein show a RO formed from three inverting stages, any number of stages may be used to generate an oscillating signal with non-50% duty cycle. In one embodiment, the delay of the third inverting stage is $T_2$ determines the phase Φ2 of the output clock signal. In this embodiment, phase Φ2 is a high phase. The low phase of the output clock signal has a duration $T_1$ which determines the phase Φ1 of the output clock signal.

In one embodiment the output of the RO is driven by a driving stage comprising transistors MP5, MP6 and MN5 and MN6. In this embodiment, transistors MN5 and MP5 receive an output of the third stage at their respective gate terminals. In one embodiment, the gate terminals of transistors MP6 and MN6 are coupled to the output of the second stage in the RO.

In the embodiment of FIG. 4, transistors MN1-MN6 are NMOS transistors and transistors MP1-MP6 are PMOS transistors. In one embodiment, the resistor R and capacitor C may be formed using transistors. In other embodiments, the resistor R is a poly resistor and the capacitor C is a metal capacitor formed from interleaving layers of metal.

FIG. 5 is a method flowchart 500 for detecting a signal using the squelch circuit, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments for sampling an incoming signal by the low power high-speed digital Rx front-end 200. The flowchart of FIG. 5 is illustrated with reference to the embodiments of FIGS. 1-4.

At block 501, the clock generation unit 112 generates the first Φ1 and second Φ2 phases of a clock signal. At block 502, the sampling unit 211 of the squelch circuit 200/11 samples a differential input signal (Rx+, Rx−) according to the first Φ1 and second Φ2 phases of the clock signal, the sampling to generate a sampled differential signal (X, Y). At block 503, the differential amplifier 212 coupled to the sampling unit 211 amplifies the sampled differential signal (X,Y) to generate an output signal (Do+, Do−). At block 504, a logic unit analyzes the output of the squelch circuit 111 and determines whether to turn off or to turn on any logic unit in a processor according to the information in the output signal (Do+, Do−).

Figure 6:
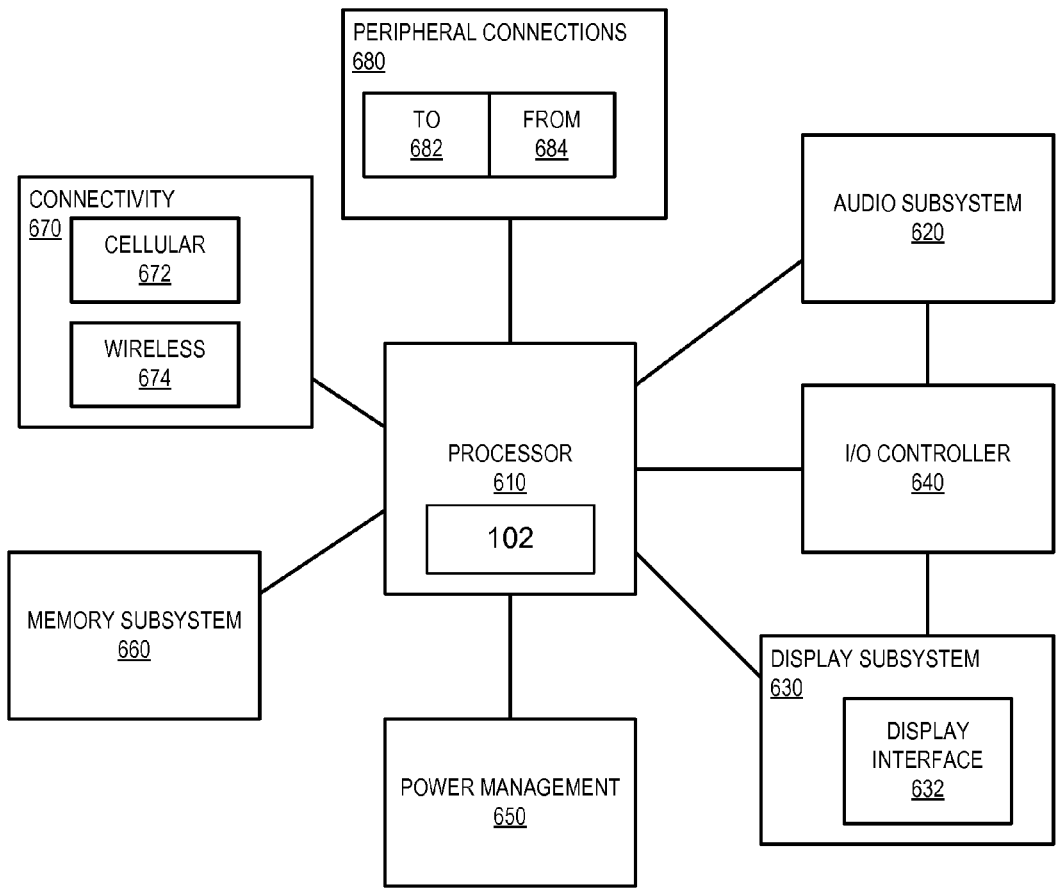
FIG. 6 is a system-level diagram of a smart device comprising a processor including the squelch circuit, according to one embodiment of the invention.

FIG. 6 is a system-level diagram of a smart device comprising a processor including the squelch circuit, according to one embodiment of the invention. FIG. 6 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes the low power squelch circuit 102/111 as discussed with reference to FIGS. 1-4.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a clock generation unit to generate first and second phases of a clock signal;
a sampling unit to sample a differential input signal according to the first and second phases of the clock signal, the sampling unit to generate a sampled differential signal, the sampling unit comprises:
  a first switch to sample a first signal of the differential input signal to generate a first sampled signal of the sampled differential signal, and
  a second switch to sample a second signal of the differential input signal to generate a second sampled signal of the sampled differential signal, wherein the first and second switches are operable by the first phase of the clock signal; and
a differential amplifier to amplify the sampled differential signal.

2. An apparatus comprising:
a clock generation unit to generate first and second phases of a clock signal;
a sampling unit to sample a differential input signal according to the first and second phases of the clock signal, the sampling unit to generate a sampled differential signal, the sampling unit comprises:
  a first switch to sample a first signal of the differential input signal to generate a first sampled signal of the sampled differential signal,
  a second switch to sample a second signal of the differential input signal to generate a second sampled signal of the sampled differential signal, and
  a third switch to couple the first signal, of the differential amplified signal, to a node coupled to the second switch; and
a differential amplifier to amplify the sampled differential signal.

3. The apparatus of claim 2, wherein the sampling unit further comprises:
a fourth switch to couple the second signal, of the differential amplified signal, to a node coupled to the first switch.

4. The apparatus of claim 3, wherein the third and fourth switches are operable by the second phase of the clock signal.

5. The apparatus of claim 1, wherein the first switch is coupled to the differential amplifier via a first capacitor.

6. The apparatus of claim 1, wherein the second switch is coupled to the differential amplifier via a second capacitor.

7. The apparatus of claim 1 further comprises a seventh switch for coupling a ground node with an input of the differential amplifier via a fourth capacitor, wherein the seventh switch is operable by the first phase of the clock signal.

8. The apparatus of claim 7 further comprises an eighth switch for coupling a high power supply node with the input of the differential amplifier via the fourth capacitor, wherein the eighth switch is operable by the second phase of the clock signal.

9. The apparatus of claim 1, wherein the sampling unit and the differential amplifier are positioned in a receiver which is one of:
a Mobile Industry Processor Interface (MIPI®) M-PHY$^{SM}$ receiver;
a Peripheral Component Interconnect Express (PCIe) receiver;
a Serial Advanced Technology Attachment (SATA) receiver;
a Serial Attached SCSI (SAS) receiver;
a Double Data Rate x (DDRx) receiver, were 'x' is an integer;
a High-Definition Multimedia Interface (HDMI) receiver; or
a Universal Serial Bus x (USBx) receiver, where 'x' is an integer.

10. The apparatus of claim 9, wherein the MIPI® M-PHY$^{SM}$ receiver is operable to receive high-speed (HS) GEAR rate signals.

11. The apparatus of claim 1, wherein the differential amplifier is operable to reject common mode in the sampled differential signal.

12. The apparatus of claim 1, wherein the differential amplifier has a built-in auto-zero function.

13. The apparatus of claim 1, wherein the differential amplifier is operable to amplify independent of offset cancellation in the sampled differential signal.

14. An apparatus comprising:
a clock generation unit to generate first and second phases of a clock signal;
a sampling unit to sample a differential input signal according to the first and second phases of the clock signal, the sampling unit to generate a sampled differential signal;
a differential amplifier to amplify the sampled differential signal; and a first switch for coupling a ground node with an input of the differential amplifier via a third capacitor, wherein the first switch is operable by the first phase of the clock signal.

15. The apparatus of claim 14 further comprises a second switch for coupling a high power supply node with the input of the differential amplifier via the third capacitor, wherein the second switch is operable by the second phase of the clock signal.

16. An apparatus comprising:
   a clock generation unit to generate first and second phases of a clock signal;
   a sampling unit to sample a differential input signal according to the first and second phases of the clock signal, the sampling unit to generate a sampled differential signal;
   a differential amplifier to amplify the sampled differential signal; and
   a first switch for coupling a first output of the differential amplifier with an input of the differential amplifier, wherein the first switch is operable by the second phase of the clock signal.

17. The apparatus of claim 16 further comprises a second switch for coupling a second output of the differential amplifier with another input of the differential amplifier, wherein the second switch is operable by the second phase of the clock signal.

18. A method comprising:
   generating first and second phases of a clock signal;
   sampling a differential input signal according to the first and second phases of the clock signal, the sampling to generate a sampled differential signal using a sampling unit comprising a first switch to sample a first signal of the differential input signal to generate a first sampled signal of the sampled differential signal, and a second switch to sample a second signal of the differential input signal to generate a second sampled signal of the sampled differential signal, wherein the first and second switches are operable by the first phase of the clock signal; and
   amplifying the sampled differential signal to generate an output signal.

19. The method of claim 18 further comprising:
turning on or off a logic unit according to the output signal.

20. A system comprising:
a wireless connectivity;
a processor, communicatively coupled to the wireless connectivity, the processor having an input-output (I/O) receiver including:
   a clock generation unit to generate first and second phases of a clock signal;
   a sampling unit to sample a differential input signal according to the first and second phases of the clock signal, the sampler to generate a sampled differential signal, wherein the sampling unit comprises
      a first switch to sample a first signal of the differential input signal to generate a first sampled signal of the sampled differential signal, and
      a second switch to sample a second signal of the differential input signal to generate a second sampled signal of the sampled differential signal, wherein the first and second switches are operable by the first phase of the clock signal; and
   a differential amplifier to amplify the sampled differential signal; and
a display unit.

21. The system of claim 20 further comprises:
a logic unit to receive an output of the differential amplifier, wherein the logic unit is operable to be turned on or off according to the output of the differential amplifier.

22. The system of claim 20, wherein the display unit is a touch screen.

* * * * *